(12) United States Patent
Minassian et al.

(10) Patent No.: US 8,269,529 B2
(45) Date of Patent: Sep. 18, 2012

(54) LOW PHASE NOISE RF SIGNAL GENERATING SYSTEM AND PHASE NOISE MEASUREMENT CALIBRATING METHOD

(75) Inventors: Shahen Minassian, Dix Hills, NY (US); Eli Levi, Dix Hills, NY (US); Richard Engel, Ridge, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days.

(21) Appl. No.: 13/182,063

(22) Filed: Jul. 13, 2011

(65) Prior Publication Data

US 2011/0279165 A1 Nov. 17, 2011

Related U.S. Application Data

(63) Continuation-in-part of application No. 12/687,283, filed on Jan. 14, 2010, now abandoned.

(51) Int. Cl.
*H03B 19/06* (2006.01)
*G06G 7/16* (2006.01)
(52) U.S. Cl. .................... 327/113; 327/105; 327/356
(58) Field of Classification Search ............... 331/46.2, 331/179, 74, 49, 96, 39; 455/208–209; 327/105, 327/113, 355–356
See application file for complete search history.

(56) References Cited

U.S. PATENT DOCUMENTS

| | | | |
|---|---|---|---|
| 3,748,398 A | 7/1973 | Schenkel et al. | |
| 4,206,421 A | 6/1980 | Bernhard et al. | |
| 4,516,085 A | 5/1985 | Effinger et al. | |
| 4,791,377 A | 12/1988 | Grandfield et al. | |
| 4,878,027 A * | 10/1989 | Carp et al. | 327/105 |
| 5,373,256 A * | 12/1994 | Nicotra et al. | 331/2 |
| 6,005,446 A | 12/1999 | Galani et al. | |
| 6,393,372 B1 | 5/2002 | Rzyski | |
| 6,459,341 B1 | 10/2002 | Oga | |
| 6,636,079 B2 | 10/2003 | Koyama | |
| 7,313,492 B2 | 12/2007 | Ortler et al. | |
| 7,928,808 B2 * | 4/2011 | Chan | 331/39 |

OTHER PUBLICATIONS

International Search Report and Written Opinion for PCT/US2011/021231 dated Sep. 20, 2011.

* cited by examiner

*Primary Examiner* — Dinh T. Le
(74) *Attorney, Agent, or Firm* — Brian Roffe

(57) ABSTRACT

Very low phase noise radio frequency (RF) source having multiple discrete frequency outputs used, for example, to calibrate phase noise measurement systems. The calibrator output frequencies can be tailored for a particular application using a scalable architecture.

20 Claims, 3 Drawing Sheets

LOW PHASE NOISE RF SIGNAL GENERATING SYSTEM AND PHASE NOISE MEASUREMENT CALIBRATING METHOD

CROSS REFERENCE TO RELATED APPLICATION

This application is a continuation-in-part of U.S. patent application Ser. No. 12/687,283 filed Jan. 14, 2010, now abandoned, incorporated by reference herein.

FIELD OF THE INVENTION

The present invention relates generally to the field of automatic test systems within the radio frequency (RF) field and more particularly, to automatic test equipment for sourcing very low phase noise RF signals for use in, for example, calibrating phase noise measurement systems. As such, an enhanced phase noise calibrator in accordance with the invention can include an RF signal generating system that is used as an RF source to calibrate the performance of phase noise measurement equipment and systems.

The present invention also relates to a method for calibrating a phase noise measurement system using a novel RF signal generating system.

BACKGROUND OF THE INVENTION

Phase noise in RF systems is often the result of short term deterministic and random frequency fluctuations about a nominal carrier frequency. These fluctuations typically have a duration of less than a few seconds and are usually represented and viewed in the frequency domain. As the performance of phase noise measurement systems improves towards the thermal noise floor dictated by kTB noise, or −174 dBm/Hz, there is a urgent need for corresponding RF sources with lower phase noise to calibrate these systems.

Effinger et al., U.S. Pat. No. 4,516,085, relates to a microwave frequency synthesizer using a plurality of switchable low noise oscillators. The frequency synthesizer includes a plurality of oscillators 20, a plurality of switches 21 one associated with each of the oscillators 20, and a high speed isolation switch 22 that cooperates with the switches 21 to select one of the oscillators 20. Another switch 23 is operative to select a multiplication factor via a multiplier 30 and filter 31, leading to another switch 32. From switch 32, an isolator 33 provides impedance matching to a mixer 41. The other input to the mixer 41 comes from one of a plurality of other oscillators in a master oscillator bank 10 through a switch 11, filter means 12 and isolator 13.

A significant problem with the frequency synthesizer of Effinger et al. is that the large number of electronic components between the oscillators 10, 20 contribute phase noise to the signal, in spite of the presence of the filter means 12 and filters 31.

Bernhard et al., U.S. Pat. No. 4,206,421, relates to an arrangement for synchronizing a free-swinging oscillator system to a reference signal of a substantially lower frequency. A regulating circuit 6 connects to the oscillator 4 to control the frequency thereof. A quartz oscillator 1 produces a reference signal that is subsequently connected to a frequency multiplier and/or frequency divider 2, an amplifier 3 and a bandpass filter 7. An output signal from the filter 7 is fed to a harmonics mixer 4' connected to the free-swinging oscillator 4 and which produces a pattern of harmonics. A selective amplifier 5 feeds an intermediate frequency obtained from the harmonics mixer 4' to the regulator circuit 6. A filter 8 connected to the quartz oscillator 1 produces harmonics which are also coupled to the regulating circuit 6. By phase or frequency comparison, the regulating circuit 6 adjusts the running frequency of the free-swinging oscillator. In essence, Bernhard et al. describes a classic phase lock loop (PLL) circuit which synchronizes (locks) one oscillator to a reference oscillator.

These prior art arrangements do not include a streamlined arrangement of electronic components that enable a signal with very low noise to be generated, i.e., a very pure signal. Rather, for example, the presence of a significant number of switching components in Effinger et al. provide the exact opposite effect in that they introduce noise into the signals being processed.

SUMMARY OF THE INVENTION

An RF signal generating system that can generate RF signals for use in calibrating phase noise measurement equipment and systems in accordance with the invention includes a plurality of medium to high power, very low phase noise crystal oscillators that is configured with various stages of multiplication, amplification and filtering to provide the basis for a multiplexed arrangement of frequencies which can then be heterodyned using a frequency mixer to produce a desired range of frequencies. The upconverted (or downconverted) output may then be amplified to maintain sufficient drive level to avoid thermal noise contributions. The amplified signal may then be filtered to isolate the desired product(s) from the frequency mixer output. The filtered upconverted output may be used directly or processed further to extend the range of frequency outputs.

BRIEF DESCRIPTION OF THE DRAWINGS

The following drawings are illustrative embodiments of the invention and are not meant to limit the scope of the invention as encompassed by the claims.

DETAILED DESCRIPTION OF PREFERRED EMBODIMENTS

Figure 1:
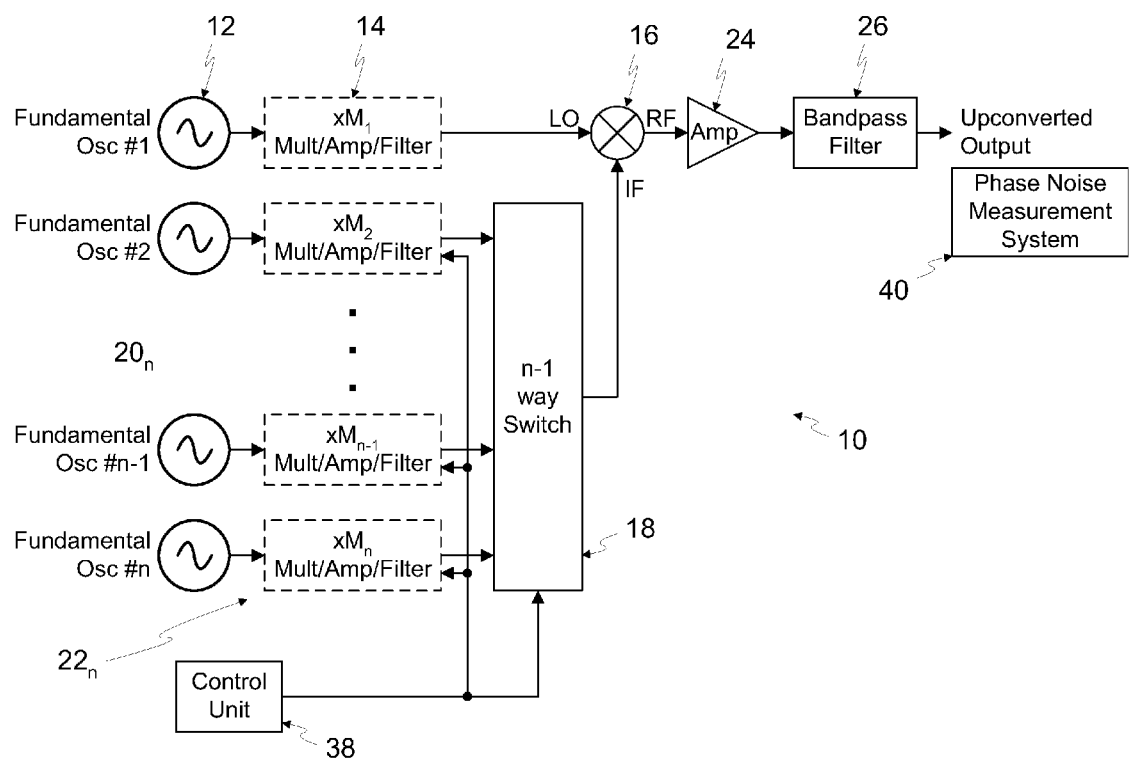
FIG. 1 shows a simplified overall block diagram of a main conversion stage of an RF signal generating system for an enhanced phase noise calibration system in accordance with the invention.

Referring to the accompanying drawings wherein like reference numerals refer to the same or similar elements, FIG. 1 shows an embodiment of an RF signal generating system for use in a system and method for calibrating a phase noise measurement system in accordance with the invention. The RF signal generating system is designated generally as 10 and includes a main crystal oscillator 12 with very low phase noise whose output signal is routed through a multiplier chain 14 consisting of a multiplier with integer multiplication factor $M_1$, which is then amplified via an amplifier or comparable structure, filtered via a filter or comparable structure, and routed to a frequency mixer 16. This signal will serve as a local oscillator (LO) input to the frequency mixer 16 and is utilized in generating all subsequent output frequencies. Thus, in this embodiment, the main crystal oscillator 12 is the only oscillator that provides a signal to the LO input of the frequency mixer 16 and thus the signal output at a single time or signals output at different times from the main crystal oscillator 12 will be the only signals used in generating all output frequencies from the frequency mixer 16.

An important feature of the invention that the main crystal oscillator 12 is not a direct digital synthesizer that provides a signal at a desired frequency. Rather, since the invention is designed with the overall objective to reduce phase noise, the oscillator 12 should be an oscillator that does not generate significant phase noise and thereby provides a pure signal, such as a crystal oscillator.

Since this multiplier chain 14 will be common to all frequencies, some form of mechanical frequency adjustment and/or electrical frequency control may be included to allow for nominal adjustment of the frequencies produced.

In an alternate embodiment, not shown, a multiplexed plurality of oscillators, either operating at their fundamental frequency or an integer multiple thereof is used to source the LO port of the frequency mixer 16 to allow a greater range of discrete frequencies to be generated. Thus, oscillator 12 represents one of one or more such oscillators while multiplier chain 14 represents one of one or more such multiplier chains.

The intermediate frequency (IF) port of the frequency mixer 16 may be sourced from a multi-pole switch, i.e., n−1 way switch 18, that allows a plurality of frequencies to be applied to the frequency mixer 16. This sourcing is provided such that there is no intervening structure that may impart phase noise to the signal from the n−1 way switch 18 to the IF port of the mixer 16. Thus, the signal from the n−1 way switch 18 comes directly to the IF port of the mixer 16, without passing through, for example, a filter, or another switch. This lack of intervening structure serves to maintain the purity of the signal.

The signals applied at the inputs of the multi-pole switch 18 can each be sourced directly from a very low phase noise crystal oscillator $20_n$, or optionally routed through a respective multiplication stage or multiplier chain $22_n$, each consisting of a multiplier with integer multiplication factor $M_n$, which is then amplified via an amplifier or comparable structure, and filtered via a filter or comparable structure. This sourcing is provided such that there is no intervening structure that may impart phase noise to the signal from each of the oscillators $20_n$ to the n−1 way switch 18, i.e., the only electronic structure between each oscillator 20 and the respective input to the n−1 way switch 18 is the respective multiplier chain 22. This lack of intervening structure serves to maintain the purity of the signal.

The integer multiplication, in the form of a doubler, tripler, quadrupler, etc., may be applied to one or more of the multiplexed very low phase noise crystal oscillators $20_n$.

The range and number of output frequencies produced at the RF output port of the frequency mixer 16 can be tailored to any specific application by selecting, via a control unit 38 coupled to the multi-pole switch 18, the number of fundamental oscillators $20_n$ providing signals to the multi-pole switch 18, appropriate fundamental oscillator frequencies, and multiplication factors used in the multiplier chains $22_n$ in conjunction with each fundamental oscillator $20_n$. The multiplication factor used with each fundamental oscillator $20_n$ need not be the same as the prior or subsequent stage. Higher multiplication factors may require the use of one or more cascaded stages of multiplication to achieve the desired multiplication factor. The control unit 38 is connected to each of the multiplier chains $22_n$ and may, in one embodiment, select the multiplication factor of the multiplier of each multiplier chain $22_n$ to be different such that the control unit 38 is able to control the multiplier chains $22_n$ and the n−1 way switch 18 to select a particular multiplied frequency for output to the IF port of the frequency mixer 16 (see FIG. 3). The control unit 38 would be programmed with information about the oscillators $20_n$ and the available multiplication factors in the multiplier chains $22_n$ and then would control the switch 18 interposed between the oscillators $20_n$ and the frequency mixer 16 to provide for the desired input frequency signal at the IF port of the frequency mixer 16.

Figure 3:
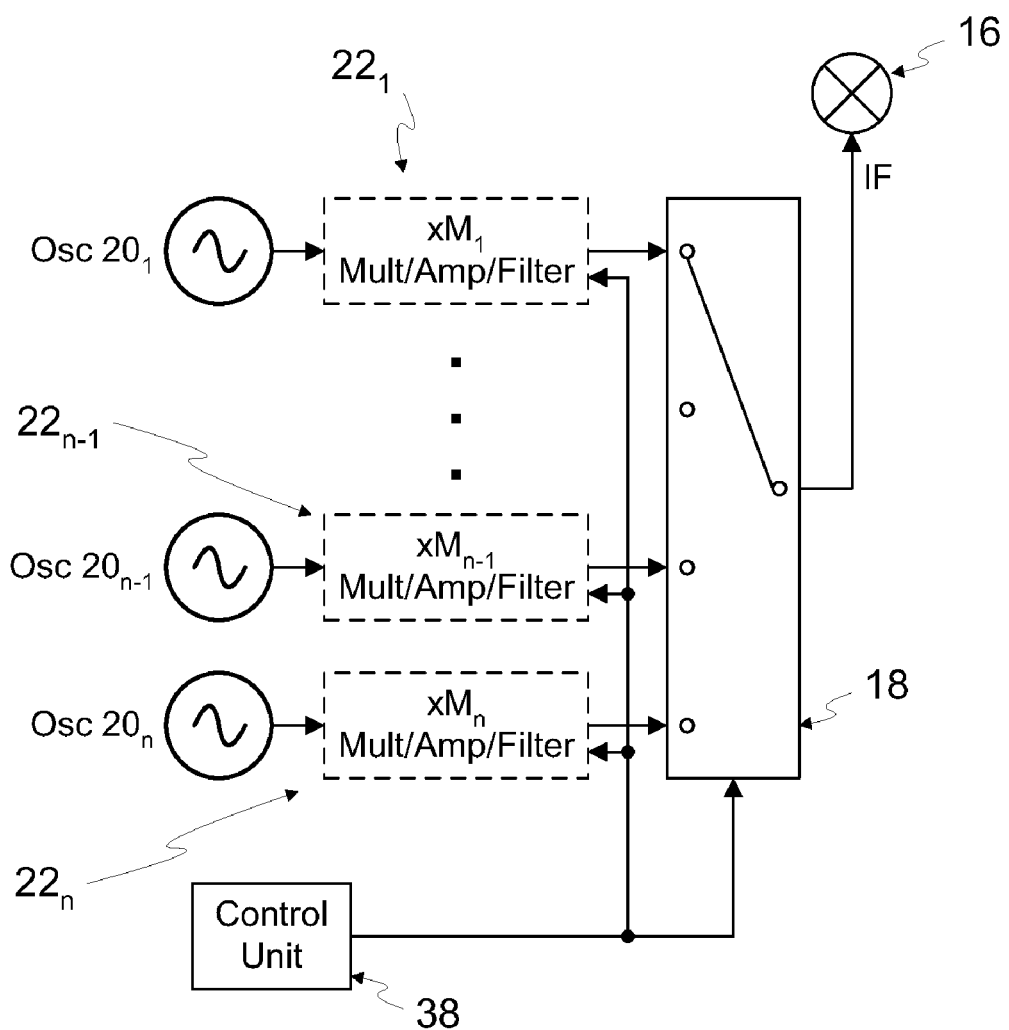
FIG. 3 is a schematic showing the manner in which the control unit controls a switch to select a multiplication factor to thereby select a particular multiplied frequency for output to a frequency mixer.

In this regard, FIG. 3 shows control lines from control unit 38 indicating that the control unit 38 can control switches to create a signal path from each multiplier chain $22_n$ to the IF port of the frequency mixer 16.

The system thus enables implementation of a fundamental main oscillator 12 in conjunction with a mixing/amplifying/filtering stage, via multiplier chain 14, and a multiplexed bank of fundamental oscillators $20_n$ to produce a selectable plurality of discrete low phase noise frequency outputs. Moreover, it can be seen that the mixer 16 receives only signals generated by a fundamental oscillator main oscillator 12 and one of the oscillators $20_n$, each of which has been passed through a multiplier chain, multiplier chain 14 in the case of the signal from the main oscillator 12 and one of the multiplier chains $22_n$ in the case of the signal from one of the oscillators $20_n$.

Another interesting feature of the invention is that switch 18 is only associated with the oscillators $20_n$ and not with the main crystal oscillator 12. Since the output signal from the multiplier chain 14 is not directed to or through the switch 18, the frequency mixer 16 receives output signals at the LO input continuously from the main oscillator 12, which signals have been directed into and through the multiplier chain 14. Frequency mixer 16 also receives output signals at the IF input from the oscillators $20_n$ via the switch 18.

The output from the RF port of the frequency mixer 16 may then be directed to an amplifier 24 and then to a bandpass filter 26 to provide upconverted output for use in calibration a phase noise measurement system 40. Additional and alternative uses of the output from the RF port of the frequency mixer 16 are also envisioned. Depending on the range of frequencies involved for an application, an alternate embodiment, not shown, may utilize a multiplexed bank of amplifiers and/or bandpass filters to handle the range of resulting very low phase noise RF mixer output frequencies. Thus, amplifier 24 and bandpass filter 26 each represent one of one or more such amplifiers and bandpass filters.

The structure shown in FIG. 1 provides a very streamlined, i.e., with a minimal amount of electronic components.

Figure 2:
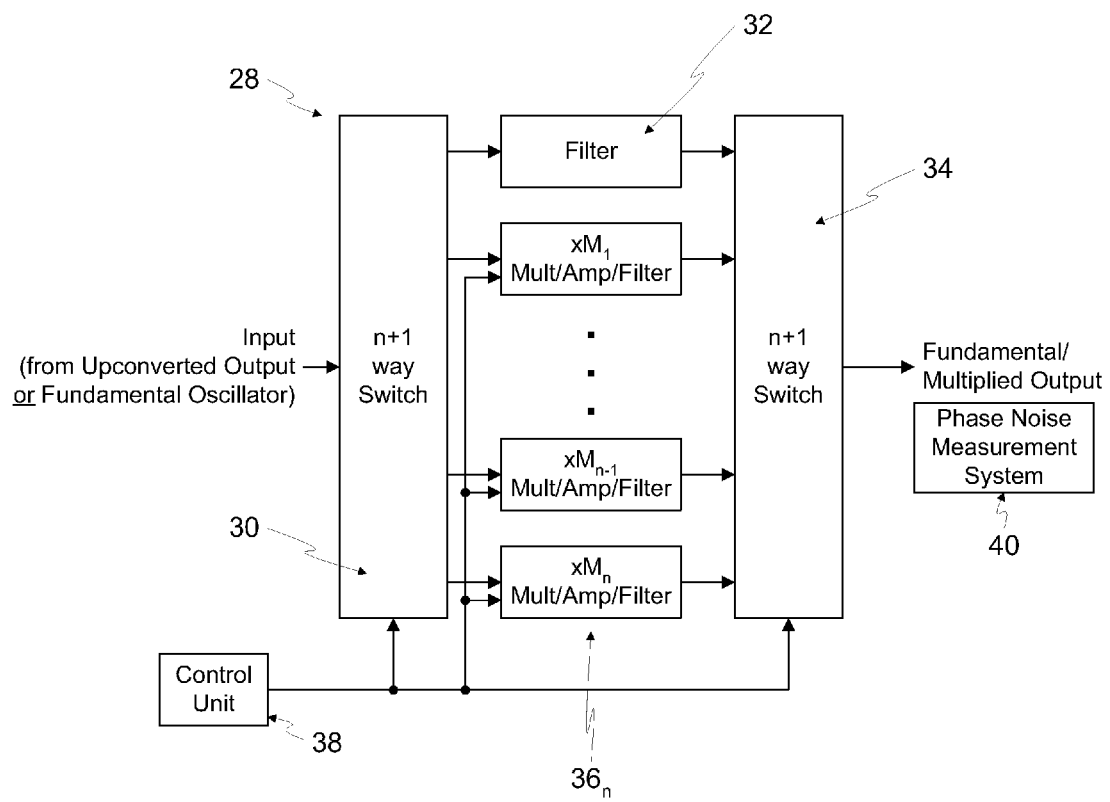
FIG. 2 shows an optional stage to follow the main conversion stage to multiplex additional filtering or additional stages of multiplication/amplification/filtering to generate additional low phase noise frequency outputs in the band(s) of interest.

Referring now to FIG. 2, the upconverted output from filter 26 may be routed through another multiplexed stage 28 of signal filtering and/or multiplication. In this stage 28, the range of input frequencies output from the filter 26 are applied to a multi-pole switch, i.e., n+1 way switch 30. This stage 28 includes a bypass path in which the input to switch 30 is filtered further via a filter 32 and fed into another multi-pole switch, i.e., n+1 way switch 34, before arriving at the common output, which may be directed to the phase noise measurement system 40. There is no multiplication or amplification of the signal passing through the bypass path.

Stage 28 also includes one or more multiplication stages $36_n$, each multiplication stage $36_n$ consisting of an integer multiplier (doubler, tripler, etc.), amplifier and bandpass filter, so that the multiplication stages $36_n$ allow the range of very low phase noise frequencies to be extended to higher frequencies. Additional stages, or multiplier chains, could be added as well, although each stage of conventional integer multiplication adds 20 log (M) dB of phase noise relative to its input so there are practical limitations to how extensible the architecture can be. Control unit 38 selects, via switch 34, of the multiplication stages $36_n$, situated between switches 28 and 34, based on a frequency of a desired calibration signal for the phase noise measurement system. This selection may be effected in a similar manner as control unit 38 selects a signal to use to provide to the IF input of the frequency mixer 16, discussed above with reference to FIG. 3.

It is envisioned that stage 28 may be used in lieu of the first stage shown in FIG. 1 as an alternate means of providing multiple very low phase noise signal sources. That is, the fundamental oscillator 12 may be coupled to the switch 30, without the interposition of the multiplier chain 14, frequency mixer 16, amplifier 24 and bandpass filter 26, and provide its output signal directly to the switch 30.

Control of the switching of switches 18, 30, 34 can be handled in various ways. In one embodiment, an embedded microprocessor or microcontroller serves as the control unit 38 and would be used to select the appropriate switch position (s) based on the desired output frequency. Other constructions of a control unit for controlling switches readily present themselves to one of ordinary skill in the art to which this invention pertains in view of the disclosure herein and are contemplated to be within the scope and spirit of the invention.

Power saving measures could be implemented to power down multiplication stages not in use. Control could be further extended to include built-in-test (BIT) units and programs, power monitoring units and programs, etc.

At the L-Band frequencies involved, the following single sideband (SSB) phase noise ranges can be met (all of the upper and lower limits of the ranges are approximate values):

100 Hz carrier offset: −105 to −110 dBc/Hz
 1 kHz carrier offset: −135 to −140 dBc/Hz
 10 kHz carrier offset: −150 to −155 dBc/Hz
 100 kHz carrier offset: −155 to −160 dBc/Hz
 500 kHz carrier offset: −159 to −164 dBc/Hz
 $\geq$1 MHz carrier offset: −159 to −164 dBc/Hz These values represent the currently achievable SSB phase noise specifications using this approach and are not meant to limit the scope of the invention as improved crystal oscillators and/or multiplication circuits may allow for performance improvements in the future.

The RF signal generating system for use in an enhanced phase noise calibrator described above is designed to source multiple output signals in the L-Band and S-Band range of frequencies, but the output frequency should not limit the scope of the invention as it may be adapted to other frequency bands. Control of the RF signal generating system for the enhanced phase noise calibrator may be through an IEEE-488 bus but the method of control should not limit the scope of the invention as it may be adapted to other parallel control means (MXI, etc.), serial (LXI, USB, RS-485, etc.), RF (Bluetooth, Wi-Fi, Zigbee, UWB, etc.) or optical (IR, fiber-optic, etc.) control buses or via discrete control.

Power for the RF signal generating system for the enhanced phase noise calibrator may be provided by linear analog power supplies, rather than switching power supplies, to limit introduction of other potential sources of phase noise which could be introduced in the form of spurious or harmonic signals relating to power line frequencies, switching frequencies, electromagnetic interference (EMI) or other undesirable contributions. Ideally, operation would be from a direct current (DC) source such as a battery, but for the operating environment in which it would be used, a DC source does not provide the most practical approach.

In the embodiments described above, the oscillators are described as being crystal oscillators. However, other types of low phase noise oscillators may be used in the invention without deviating from the scope and spirit thereof. However, direct digital synthesizers, and other types of frequency synthesized sources that generate signals with significantly greater phase noise than crystal oscillators, are expressly not used in the invention.

The foregoing invention provides, in view of the minimal electronic componentry, a signal with very low phase noise. By providing an input signal to the IF port of a frequency mixer 16 from one of a plurality of oscillators $20_n$, with this signal passing only through a multiplier chain $22_n$ and the switch 18, there are no excess components that generate unwanted phase noise. There are no extra switches or other electronic structure that can inherently introduce phase noise to the signal. As such, the IF port input system consists solely of the oscillators $20_n$, the multiplier chains $22_n$ and the switch 18. There is no other structure that materially affects the signal processing.

Similarly, by providing an input signal to the LO port of a frequency mixer 16 from oscillator 12, with this signal passing only through a multiplier chain 14, there is little room to enable phase noise to be generated. There are no extra switches or other electronic structure that can inherently introduce phase noise to the signal. As such, the LO port input system consists solely of the oscillator 12 and the multiplier chain 14. There is no other structure that materially affects the signal processing.

Purity of the signal provides by the frequency mixer 16 is thus very high, resulting from the purity or low phase noise of the two signals input to the frequency mixer 16.

An innovative aspect of the invention is that signals from all of the low phase noise generating oscillators $20_n$ are continuously powered to insure all fundamental oscillators are stabilized and achieve optimum operating parameters. Unused multiplier/amplifier chains are powered down to provide additional signal isolation such that any potential sources of spurious signals are minimized and do not contaminate the signal purity of the multiplier/amplifier chain of interest. This powering down is effected by the control unit 38 being electrically coupled to and controlling each of the multiplier chains $22_n$ (see the connections between the control unit 38 and the multiplier chains $22_n$ in FIGS. 1-3). As such, control unit 38 has at its control, any one of the signals and can control the switch 18 to pass through any one of the signals to the IF port of the frequency mixer 16 as well as control of the various multiplier chains $22_n$. When a change in the signal output from the switch 18 to the frequency mixer 16 is desired, the control unit 38 also enables the appropriate one of the multiplier chains $22_n$. Since all fundamental oscillators are continuously powered and operating, there is minimal delay when switching to another discrete frequency.

The method in accordance with the invention therefore has continuous generation of a plurality of discrete frequency signals, with all of these signals being readily available to be provided to one port of the frequency mixer 16 solely by control of switch 18 effected by control unit 38. Moreover, the other port of the frequency mixer is also sourced from a low phase noise generating oscillator 12. Indeed, in one embodiment, all of the oscillators 12, $20_n$ are the same, i.e., crystal oscillators.

In the prior art discussed above, i.e., Effinger et al. and Bernhard et al., there is no consideration of the desire to generate a very low phase noise signal, and arranging for this by providing very low phase noise oscillators as in the present invention and a minimal electronic structure between the oscillators and the mixer. Effinger et al. is said to be a low noise microwave frequency synthesizer but overlooks the fact that the numerous switches and signal isolators actually create phase noise. Thus, the presence of no fewer than four different switches between the oscillators 20 and the frequency mixer 41 is highly disadvantageous as it introduces significant phase noise to the signal being input to the frequency mixer 41. These four switches are required in accordance with the teachings of Effinger et al.

Accordingly, with the minimal structure in the invention, i.e., with the crystal oscillator 12 providing a continuous signal to the mixer 16 via multiplier chain 14 and crystal oscillators $20_n$ providing continuous signals to the switch 18 via multiplier chains $22_n$, the signals provided to the mixer 16 are very low phase noise, i.e., of exemplary purity. Construction of an electronic circuit with these components with a view toward providing a very low phase noise signal, i.e., a very pure signal, is not obvious from Effinger et al. and Bernhard et al., neither of which appreciate the possibility of using low phase noise crystal oscillators to provide input to both ports of the same frequency mixer, with one port being sourced from one of a plurality of different oscillators depending on a desired frequency. The overriding goal of the invention to provide a low phase noise signal, with the limited structure disclosed herein, therefore cannot be derived from Effinger et al. and Bernhard et al., nor Grandfield et al. (U.S. Pat. No. 4,791,377). The invention simply addresses different issues and concerns than those addressed by Bernhard et al. and Grandfield et al.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. Indeed, it is envisioned that any feature shown in or described in connection with one embodiment may be applied to any of the other embodiments shown or described herein to the extent not inconsistent with a particular feature of that embodiment.

What is claimed is:

1. A system for generating a very low phase noise signal, comprising:
    at least one first low phase noise oscillator each providing an output signal;
    at least one first multiplier chain that receives the output signal from a respective one of said at least one first oscillator, each of said at least one first multiplier chain including a multiplier that multiplies the signal frequency by integer multiplication factor $M_1$, an amplifier that amplifies the multiplied signal and a filter that filters the amplified signal;
    a frequency mixer having a local oscillator (LO) input, an intermediate frequency (IF) input and a low phase noise radio frequency (RF) output, said at least one first multiplier chain providing an output signal that is continuously input from said at least one multiplier chain to said LO input of said frequency mixer;
    a plurality of second low phase noise oscillators each providing output signal;
    a first, multi-pole switch coupled to said second oscillators and said IF input of said frequency mixer and arranged to provide an output signal derived from a signal from at least one of said second oscillators to said IF input of said frequency mixer;
    a plurality of second multiplier chains,
        each of said second multiplier chains continuously receiving an output signal only from a respective one of said second oscillators, modifying the received output signal and providing the modified output signal to said first switch,
        each of said second multiplier chains including a multiplier that multiplies the signal frequency of the output signal of said respective second oscillator by an integer multiplication factor, an amplifier that amplifies the multiplied signal and a filter that filters the amplified signal, the filtered, amplified signal being directed to said first switch and then through said first switch to said IF input of said frequency mixer; and
    a control unit that determines a frequency being input to said IF input of said frequency mixer to enable variation of a range and number of output frequencies at said RF output of said frequency mixer,
    said control unit being coupled to said second multiplier chains and controlling via said second multiplier chains, modification of the output signals of said second oscillators received by said second multiplier chains,
    said control unit being further coupled to said first switch and controlling said first switch to select one of said second oscillators to provide an input signal to said IF input of said frequency mixer such that the output signal from said selected one of said oscillators, after modification by the respective one of said second multiplier chains under control of said control unit, is a source of the input signal to said IF input of said frequency mixer.

2. The system of claim 1, wherein said at least one first oscillator and all of said second oscillators are crystal oscillators with very low phase noise.

3. The system of claim 1, wherein said second multiplier chains are equal in number to said plurality of second oscillators, said multiplier of each of said second multiplier chains being different than said multiplier of other of said second multiplier chains.

4. The system of claim 3, wherein the multiplication factor of said multiplier of each of said second multiplier chains is different and said control unit controls, upon consideration of the multiplication factor of said second multiplier chain or the frequency of the output signals from said second oscillators, said first switch and said multiplier chains to select a particular multiplied frequency for output to said IF input of said frequency mixer.

5. The system of claim 1, wherein said control unit controls modification of the output signals of said second oscillators via said second multiplier chains by selecting the multiplication factor of said multiplier of each of said second multiplier chains.

6. The system of claim 1, further comprising:
    at least one bandpass filter that receives output from said RF output of said frequency mixer;
    a second switch arranged to receive the output from said at least one bandpass filter;
    at least one multiplication stage following said second switch; and
    a third switch following said at least one multiplication stage, each of said at least one multiplication stage including a multiplier that multiplies the signal frequency by an integer multiplication factor, an amplifier that amplifies the multiplied signal and a filter that filters the amplified signal.

7. The system of claim 6, further comprising a bypass path between said second and third switches including only a filter.

8. The system of claim 6, wherein said control unit is arranged to control said second and third switches and said at least one multiplication stage following said second switch to select a multiplication stage based on a frequency of a desired output signal.

9. An automatic test equipment for calibrating phase noise measurement systems including the system of claim 1.

10. The system of claim 1, wherein said at least one first oscillator consists of a single oscillator whose output signal is thus used in generating all output frequencies from said frequency mixer.

11. The system of claim 10, wherein said at least one first multiplier chain consists of a single multiplier chain interposed between said single oscillator and said LO input of said frequency mixer such that said single multiplier chain is common to all frequencies.

12. The system of claim 1, wherein said first switch is the only switch between said second oscillators and said frequency mixer.

13. The system of claim 1, wherein said first switch is a first switch in a signal path from said second oscillators such that output signals from said second oscillators do not pass through another switch before said first switch.

14. A method for calibrating a phase noise measurement system, the method comprising:
generating a very low phase noise signal by means of an RF signal generating system including:
at least one first oscillator,
a frequency mixer having a local oscillator (LO) input, an intermediate frequency (IF) input and a low phase noise radio frequency (RF) output,
at least one first multiplier chain interposed between a respective one of the at least one first oscillator and the LO input of the frequency mixer such that an output signal from the at least one first multiplier chain is input from the at least one first multiplier chain to the LO input of the frequency mixer, and each of the at least one first multiplier chain including a multiplier that multiplies the signal frequency by integer multiplication factor $M_1$, an amplifier that amplifies the multiplied signal and a filter that filters the amplified signal;
a plurality of second oscillators each providing output signal; and
a first, multi-pole switch coupled to the second oscillators and the IF input of the frequency mixer, the first switch being arranged to provide an output signal derived from a signal from at least one of the second oscillators to the IF input of the frequency mixer;
arranging a plurality of second multiplier chains between the second oscillators and the first switch, each of the second multiplier chains being arranged to continuously receive an output signal only from a respective one of the second oscillators, modify the received output signal and provide the modified output signal to the first switch, each of the second multiplier chain including a multiplier that multiplies the signal frequency of the respective second oscillator by an integer multiplication factor, an amplifier that amplifies the multiplied signal and a filter that filters the amplified signal;
directing the filtered, amplified signal from each second multiplier chain to the first switch; and
controlling the first switch and the second multiplier chains, via a control unit coupled to the first switch and the second multiplier chains, to control modification of the output signals of the second oscillators via the second multiplier chains and cause at least one of the filtered, amplified signals from one of the second multiplier chains to be passed through the first switch to the IF input of the frequency mixer to thereby control a frequency of the output from the first switch to the IF input of the frequency mixer to vary a range and number of output frequencies at the RF output of the frequency mixer; and
directing the signal output from the frequency mixer toward the phase noise measurement system.

15. The method of claim 14, wherein the step of directing the signal output from the frequency mixer toward the phase noise measurement system comprises directing the signal output from the frequency mixer to at least one amplifier and at least one bandpass filter to provide upconverted output.

16. The method of claim 14, further comprising selecting frequencies of the oscillators to provide output frequencies in the L-B and or S-Band range.

17. The method of claim 14, wherein the step of directing the signal output from the frequency mixer toward the phase noise measurement system comprises directing the signal through a second switch, at least one multiplication stage following the second switch and a third switch following the at least one multiplication stage, each of the at least one multiplication stage including a multiplier that multiplies the signal frequency by an integer multiplication factor, an amplifier that amplifies the multiplied signal and a filter that filters the amplified signal.

18. The method of claim 17, wherein the at least one multiplication stage comprises a plurality of multiplication stages, further comprising selecting one of the plurality of multiplication stages based on a frequency of a desired calibration signal for the phase noise measurement system via a control unit connected to the at least one multiplication stage.

19. The method of claim 14, wherein the multiplication factor of the multiplier of each of the second multiplier chains is different and the control unit controls the first switch and the second multiplier chains to select a particular multiplied frequency for output to the IF input of the frequency mixer.

20. The method of claim 14, wherein the at least one first oscillator consists of a single oscillator whose output signals is thus used in generating all output frequencies from the frequency mixer.

* * * * *